US009692208B2

(12) United States Patent
Michiue et al.

(10) Patent No.: US 9,692,208 B2
(45) Date of Patent: Jun. 27, 2017

(54) METHOD OF MANUFACTURING SEMICONDUCTOR DEVICE

(71) Applicant: NICHIA CORPORATION, Anan-shi, Tokushima (JP)

(72) Inventors: Atsuo Michiue, Anan (JP); Yasuhiro Kawata, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/067,724

(22) Filed: Mar. 11, 2016

(65) Prior Publication Data

US 2016/0197456 A1 Jul. 7, 2016

Related U.S. Application Data

(62) Division of application No. 12/791,474, filed on Jun. 1, 2010, now Pat. No. 9,318,874.

(30) Foreign Application Priority Data

Jun. 3, 2009 (JP) ................ 2009-134281

(51) Int. Cl.
*H01S 5/22* (2006.01)
*H01S 5/323* (2006.01)
(Continued)

(52) U.S. Cl.
CPC .............. *H01S 5/22* (2013.01); *H01S 5/0425* (2013.01); *H01S 5/32341* (2013.01);
(Continued)

(58) Field of Classification Search
CPC ....................................... H01S 5/22
(Continued)

(56) References Cited

U.S. PATENT DOCUMENTS 4,095,330 A 6/1978 Kim
5,504,768 A 4/1996 Park et al.
(Continued)

FOREIGN PATENT DOCUMENTS

JP H11-004039 A 1/1999
JP 2000-114664 A 4/2000
(Continued)

OTHER PUBLICATIONS

Extended European Search Report of the corresponding European Application No. 0164884.8, dated Feb. 13, 2014.

*Primary Examiner* — Fernando L Toledo
*Assistant Examiner* — Valerie N Newton
(74) *Attorney, Agent, or Firm* — Global IP Counselors, LLP (57) ABSTRACT

A method of manufacturing a semiconductor device includes: forming a ridge on a semiconductor layer stacked on a substrate by removing a part of the semiconductor layer; forming an electrode on the ridge so as to have a flat portion having a flat surface substantially parallel to the upper surface of the ridge and sloped portions on both sides of the flat portion with each of the sloped portions having a sloped surface that is sloped with respect to the upper surface of the ridge; forming a protective film disposed on each side of the ridge to cover a region from the side surface of the ridge to the sloped surface of the sloped portion of the electrode; and forming a pad electrode at least on an upper surface of the electrode and the protective film.

19 Claims, 6 Drawing Sheets

(51) Int. Cl.
*H01S 5/042* (2006.01)
*H01S 5/02* (2006.01)

(52) U.S. Cl.
CPC .......... *H01S 5/0213* (2013.01); *H01S 5/0218* (2013.01); *H01S 5/2205* (2013.01); *H01S 2301/176* (2013.01)

(58) Field of Classification Search
USPC ................................................ 438/612, 412
See application file for complete search history.

(56) References Cited

U.S. PATENT DOCUMENTS

| | | |
|---|---|---|
| 7,167,497 B2 | 1/2007 | Sano |
| 8,358,674 B2 | 1/2013 | Sonobe et al. |
| 2004/0147094 A1 | 7/2004 | Haberern et al. |
| 2005/0178471 A1 | 8/2005 | Goto et al. |
| 2005/0184299 A1 | 8/2005 | Matsumura et al. |
| 2008/0073716 A1 | 3/2008 | Yamamoto et al. |
| 2011/0089401 A1 | 4/2011 | Hiraiwa et al. |

FOREIGN PATENT DOCUMENTS

| | | |
|---|---|---|
| JP | 2004-022989 A | 1/2004 |
| JP | 2004-071808 A | 3/2004 |
| JP | 2004-119772 A | 4/2004 |
| JP | 2005-294306 A | 10/2005 |
| JP | 2006-511942 A | 4/2006 |
| JP | 2008-098349 A | 4/2008 |
| WO | 2004-059809 A2 | 7/2004 |

METHOD OF MANUFACTURING SEMICONDUCTOR DEVICE

CROSS-REFERENCE TO RELATED APPLICATIONS

This is a divisional application of U.S. patent application Ser. No. 12/791,474 filed on Jun. 1, 2010. This application claims priority to Japanese Patent Application No. 2009-134281 filed on Jun. 3, 2009. The entire disclosures of U.S. patent application Ser. No. 12/791,474 and Japanese Patent Application No. 2009-134281 are hereby incorporated herein by reference.

BACKGROUND

Technical Field

The present invention relates to a semiconductor device and a method of manufacturing the semiconductor device, and particularly to a semiconductor device having a ridge and a method of manufacturing the semiconductor device.

Related Art

There has been proposed is a compound semiconductor device in which a stripe-shaped ridge is formed on a surface of a p-side semiconductor layer of a compound semiconductor device, and a part of an active layer below the ridge is designated as an optical waveguide region. In such a compound semiconductor device, generally, a stripe-shaped ridge is formed on a surface of a compound semiconductor layer stacked on a substrate, and an electrode is electrically connected on the stripe-shaped ridge.

Typical examples of such a compound semiconductor include a group III-V compound semiconductor, in which a compound semiconductor having a desired composition ratio can be obtained by using one or a plurality of group III elements or group V elements. Among those, as a semiconductor laser capable of emitting light from ultraviolet region to visible light region including green region, a semiconductor laser using a nitride semiconductor such as InAlGaN has been extensively studied.

For example, in a case where a material such as GaAs is used, due to its low contact resistivity, its effects on the laser operating characteristics is hardly expected even if the contact area between the upper surface of the stripe-shaped ridge and the electrode is changed, and a meaningful increase in laser operating voltage is unlikely to occur. Whereas, in a case where a material made of a nitride semiconductor such as GaN is used, due to its higher contact resistivity compared to that of GaAs, the contact resistivity between the electrode and the upper surface of the ridge may be increased according to a change in the contact area between the upper surface of the ridge and the electrode, which may results in increase in laser operating voltage.

In a case where the width of the ridge is increased in order to prevent increase in the contact resistance between the electrode and the upper surface of the ridge, the resulting laser beam will be a multimode laser beam. Even in an application in which a semiconductor device capable of emitting multimode laser beam can be used, the area of the electrode is increased by increasing the ridge width, so that absorption of laser beam at the electrode may generate a problem. An increase in loss due to absorption of laser beam at the electrode as described above may result in decrease in the slope efficiency.

JP 2004-22989A discloses formation of an upper electrode layer and a ridge stripe, in which, an upper electrode layer (10) is formed on a stacked layer structure (100) of a nitride gallium-based compound semiconductor, and a photoresist (40) for stripe is disposed thereon, then, the upper electrode layer and the ridge stripe is formed by using the photoresist as a mask.

JP 2004-119772A discloses formation of a ridge 109a, in which a stacked layer pattern of a $SiO_2$ layer 4 and a $ZrO_2$ layer 5, and the ridge 109a is formed by way of dry etching using the $ZrO_2$ layer 5 as a mask. Next, after depositing a $ZrO_2$ film on the entire surface, the stacked layer pattern described above is used as a mask for liftoff to selectively leave the $ZrO_2$ film 7a at the both sides of the ridge 109a.

JP 2008-98349A discloses formation of a ridge, in which a stacked layer mask part which is made of three layers and has a stripe-shaped pattern is disposed and a ridge part is formed using the stacked layer mask part as a mask. Next, only the mask part at the second sub-layer of the stacked layer mask part is etched from the side surface to form a neck part in the stacked layer mask part, then an insulating film is vapor-deposited on the entire upper surface of this condition. Next, the stacked layer mask part is dissolved to liftoff the insulating layer disposed on the surface of the stacked layer mask part, and an opening of the insulating layer is defined in the upper surface of the ridge part.

SUMMARY

JP 2004-22989A features reduction of variation in the width of the electric current injection region, and JP 2004-119772A features precise control of the width of a protruded portion. JP 2008-98349 features controlling variation in driving current and/or driving voltage of a laser device by preventing an insulating material from depositing on the upper surface of the ridge.

These methods of manufacturing described above concern a means of controlling the width of ridge and/or electrode on the ridge, but do not concern about preventing absorption of laser beam by the electrode formed on the ridge, and thus, they are still subjected to the problems described above.

Reduction in slope efficiency occurs when an electrode on the ridge absorbs the emitted laser beam. Accordingly, a need arises for a semiconductor device which can control the contact resistance between the nitride semiconductor and the electrode at the upper surface of the ridge, and which can prevent light absorption by the electrode on the ridge.

Accordingly, the present invention is conceived in view of the above-described problems, and an object of the present invention is to provide a semiconductor device and a method of manufacturing the semiconductor device, which is capable of preventing light absorption by an electrode and has improved reliability, while realizing a simplified method of manufacturing.

A method of manufacturing a semiconductor device according to a second aspect of the present invention includes: forming a ridge on a semiconductor layer stacked on a substrate by forming a first mask layer having a predetermined shape on the semiconductor layer and removing a part of the semiconductor layer from an opening of the first mask layer; forming a second mask layer on a region from at least a bottom surface region of the ridge to the first mask layer on an upper surface of the ridge; removing a part of the second mask layer on the upper surface of the ridge to define an opening having a diameter smaller than a width of the ridge; removing the first mask layer on the upper surface of the ridge to expose the upper surface of the ridge; forming an electrode on the ridge so as to have a flat portion having a flat surface substantially parallel to the upper surface of the ridge and sloped portions on both sides of the flat portion with each of the sloped portions having a sloped surface that is sloped with respect to the upper surface of the ridge; removing the second mask layer; forming a third mask layer on the flat surface of the flat portion of the electrode; forming a protective film on a region from at least the bottom surface region of the ridge to the third mask layer on the upper surface of the ridge; removing the third mask layer and a part of the protective film on the upper surface of the ridge to expose the electrode; and forming a pad electrode at least on an upper surface of the electrode and the protective film.

Also, it is preferable that the method of manufacturing a semiconductor device described above further includes at least one described below.

(1) The removing of the third mask layer and the part of the protective film includes removing the part of the protective film so that an uppermost end position of the protective film is higher than the upper surface of the electrode and so that the protective film is disposed on each side of the ridge to cover a region from the side surface of the ridge to the sloped surface of the sloped portion of the electrode.

(2) The forming of the pad electrode includes forming the pad electrode on the electrode through a conductive layer.

A semiconductor device according to the present invention is capable of preventing light absorption by an electrode, so that a semiconductor device with improved reliability can be obtained.

Also, according to a manufacturing method of a semiconductor device according to the present invention, etchback step can be omitted, so that yield can also be improved.

Also, a wider range of materials can be used for the protective film and electrodes, so that an expensive material is no longer needed to be selected.

BRIEF DESCRIPTION OF THE DRAWINGS

Referring now to the attached drawings which form a part of this original disclosure.

DETAILED DESCRIPTION OF EXEMPLARY EMBODIMENTS

Preferred embodiments of the semiconductor device and the method of manufacturing the semiconductor device according to the present invention will now be described below with reference to the accompanying drawings.

Figure 1:
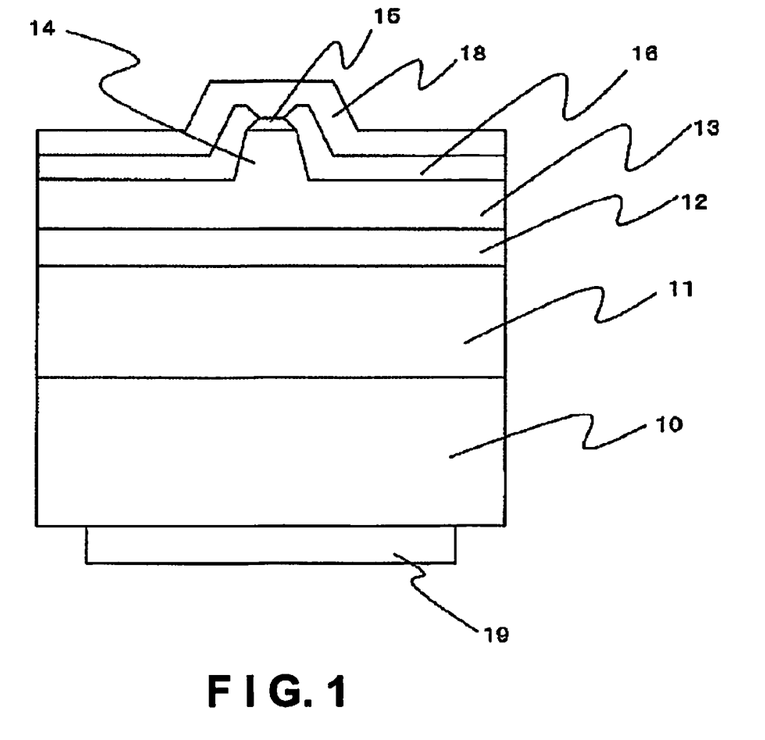
FIG. 1 is a schematic cross sectional view illustrating a structure of a semiconductor device according to an embodiment of the present invention.

A semiconductor device according to the present invention includes mainly, a substrate, a semiconductor layer, an electrode, and a protective film. Such a semiconductor device typically has, as shown in FIG. 1, a semiconductor layer 20 made of an n-side semiconductor layer 11, an active layer 12, and a p-side semiconductor layer 13 stacked in this order on a substrate 10, and a stripe-shaped ridge 14 is formed on a surface of the semiconductor layer 20. An electrode 15 is formed on an upper surface 14c of the ridge. The electrode 15 has a flat portion 15a and sloped portions 15b disposed on both sides of the flat portion 15a. The flat portion 15a has a flat surface substantially parallel to the upper surface 14c of the ridge, and each of the sloped portions 15b has a sloped surface that is sloped with respect to the upper surface 14c of the ridge. A protective film 16 is formed on the bottom surface region 14a of the ridge and a side surface 14b of the ridge, and the protective film 16 further covers a sloped portion 15b of the electrode 15. As used herein a "side of the ridge" refers to a lateral side of the ridge as viewed in a direction in which the stripe-shaped ridge extends (as seen in FIG. 1), and a "side surface of the ridge" refers to a lateral side surface of the ridge that extends in the direction in which the stripe-shaped ridge extends. Also, as used herein, a "bottom surface region of the ridge" refers to a region including an upper surface of the semiconductor layer that is disposed on a side of the ridge.

Herein, the cross-sectional shape of the electrode 15 formed on the upper surface 14c of the ridge has a flat portion 15a over the center portion of the ridge and a sloped portion 15b on the both sides of the flat portion, the sloped portion has a thickness decreasing from the ends of the flat portion toward respective side surfaces 14b of the ridge. The width of the flat portion of the electrode is 1.8 μm to 25.0 μm. The length of the sloped portion 15b is the length from the end of the flat portion 15a to the end of the upper surface of the ridge along the surface, and can be appropriately adjusted according to the width of the ridge and the width of the flat portion 15a of the upper surface of the ridge, but the length of the sloped portion is preferably in a range of 0.1 μm to 3.0 μm. Herein, the width of the ridge is the width of the upper surface 14c of the ridge. The sloped portion 15 of the electrode may include a region with two or more steps and/or a parabolic shape.

The thickness of the electrode 15 is 100 nm to 500 nm. In this specification, the term "thickness of electrode" means the height from the upper surface 14c of the ridge to the surface of the flat portion 15a of the electrode. The thickness of the sloped portion 15b of the electrode is the height from the upper surface 14c of the ridge to the surface of the sloped portion 15b of the electrode, but the height may vary depending on the measured position. The width of the electrode at the upper surface 14c of the ridge is approximately the same as the width of the ridge, but in a case where the width of the ridge is 7 μm or larger, the width of the electrode may be smaller than the width of the ridge. With this arrangement, absorption of laser beam by the electrode can be prevented efficiently. The inclination θb of the sloped portion 15b of the electrode is an angle between the upper surface 14c of the ridge and a sloped portion 15b, and can be appropriately adjusted according to the width of the ridge, the width of the flat portion of the electrode, and the thickness of the electrode, which is for example about 10° to about 30°.

An uppermost end of the end portion 16a of the protective film 16 which is formed on the side surface 14b of the ridge of the semiconductor device is positioned higher than the upper portion 14c of the ridge, and also covers the sloped portion 15b of the electrode 15. Herein, the protective film 16 does not cover the flat portion 15a of the electrode 15 on the upper surface of the ridge, so that a contact area between the electrode 15 and the pad electrode 18 can be secured. Also, depending on the length of the sloped portion 15b of the electrode, the end portion 16a of the protective film is not necessarily cover the entire surface of the sloped portion 15b of the electrode, as long as the end portion of the protective film covers 80% or larger area of the surface of the sloped portion 15b of the electrode at least at one side. Absorption of laser beam by the electrode can be prevented more efficiently with the uppermost end of the end portion 16a of the protective film 16 arranged at a higher position than the flat portion 15a of the electrode 15.

In particular, in manufacturing a single mode semiconductor laser device, even if the width of the electrode formed on the ridge is adjusted, if the width of the ridge is wide, the laser beam emitted from the laser device becomes multi-mode. If the application of the semiconductor laser device allows employing beam of multimode type, the laser beam being multimode may not be a problem, but the width of the electrode increases in proportion to the width of the ridge, the resulting absorption of laser beam by the electrode will be more problematic. The above described arrangements of the present invention allow efficient prevention of absorption of laser beam at the electrode on the ridge even in such a semiconductor laser device of wide-ridge type. To be specific, the length of the sloped portion 15b of the electrode is increased as the width of the ridge is increased.

On the other hand, merely reducing the width of the electrode on the ridge may result in increasing in the operating voltage. With this, a semiconductor laser device of high reliability cannot be obtained. A semiconductor device according to the present invention with the structure described above enables to fully utilize the width of the ridge, so that increase in the operating voltage can be prevented and further, stable lateral confinement of light can be achieved.

Further, such a semiconductor device includes a pad electrode 18 which covers the electrode 15 on the ridge 14 and the protective film 16. Moreover, the semiconductor device may have a second protective film formed on a side surface of the semiconductor layer 20. Although not shown, the front-side end surface and/or the rear-side end surface, each of which is a cavity end surface of the semiconductor device, is provided with a protective film made of insulating oxide film or nitride film, for example. It is sufficient that the protective film 16 and the second protective film are made of an insulating material, which further preferably has a low refractive index.

As shown in FIG. 1, an n-electrode 19 is formed on the back surface of the substrate. Alternately, an n-electrode 19 may be formed in contact with the n-side semiconductor layer 11 on the semiconductor layer 20 side of the substrate.

In the semiconductor device according to the present invention, the region of the semiconductor layer to which the electrode 15 is connected is only the upper surface 14c of the ridge. Therefore, occurrence of current leakage due to the electrode being in contact with a side surface of the ridge can be avoided. The end portion 16a of the protective film 16 covers the sloped portion 15b of the electrode, which enables to prevent the electrode detaching from the ridge. The pad electrode 18 is in contact with the bonding interface between the electrode 15 and the protective film 16. The cross section of the bonding interface region between the electrode 15 and the protective film 16 has a recessed shape with the upper surface of the electrode 15 forming a bottom of the recessed shape and the end surfaces of the protective film 16 forming side surfaces of the recessed shape, therefore adhesion between the pad electrode 18 and the electrode 15 can be improved by forming the pad electrode in the recess. The pad electrode 18 also covers an outer surface of the protective film 16 as well as the recess.

Figure 3:
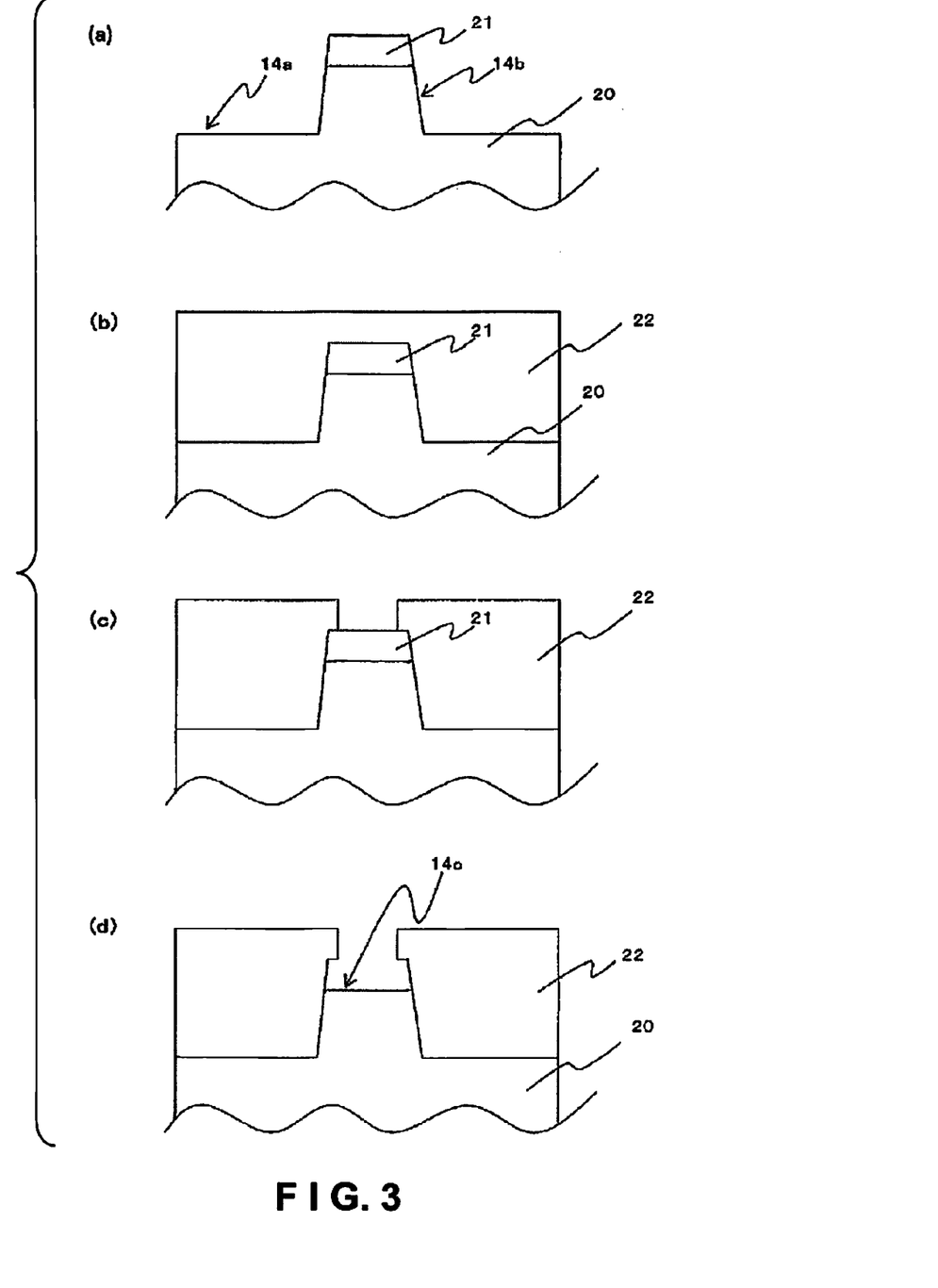
FIG. 3 includes diagrams (a) to (d) that are schematic cross-sectional views illustrating a method of manufacturing a semiconductor device according to the present invention.
Figure 4:
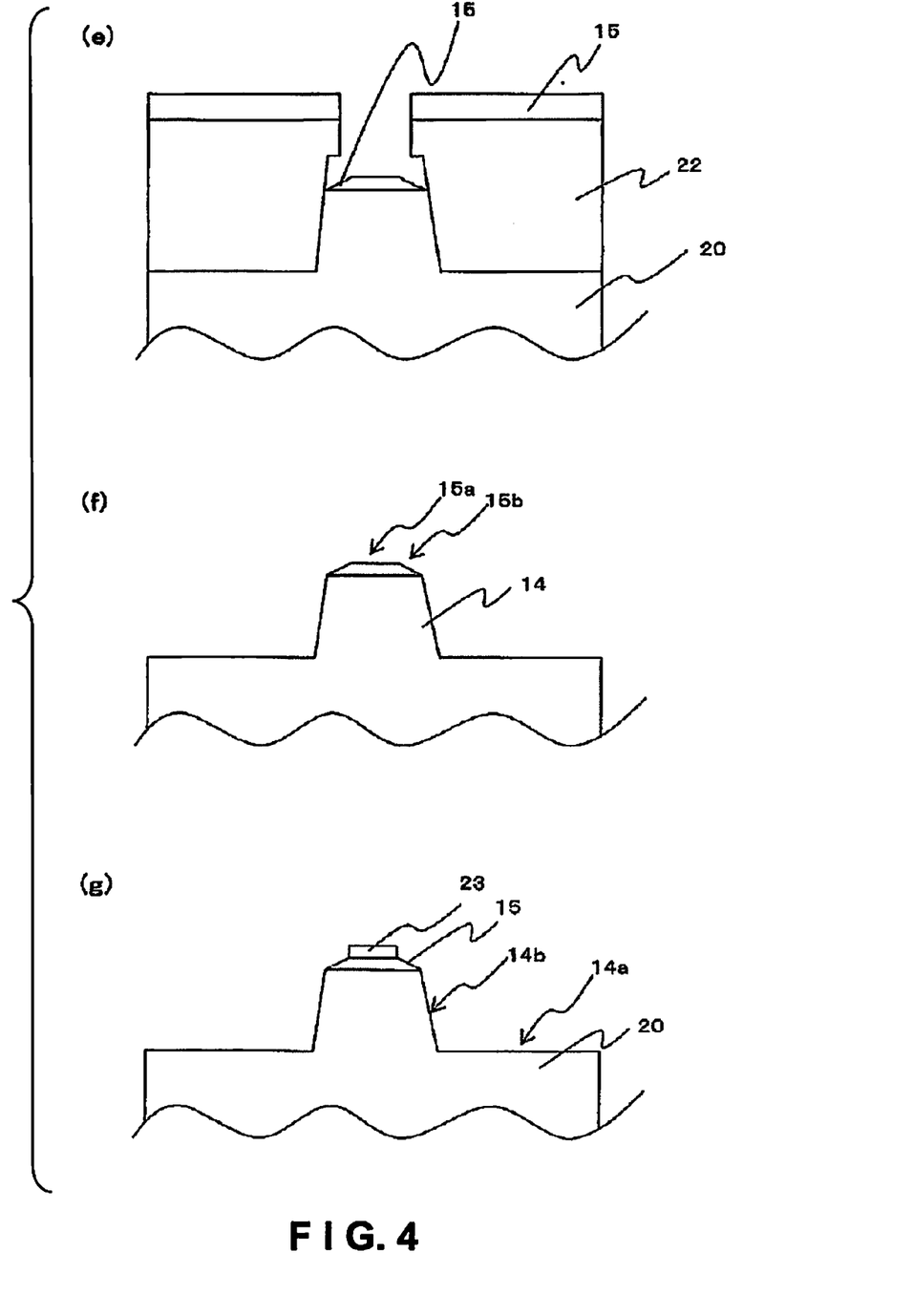
FIG. 4 includes diagrams (e) to (g) that are schematic cross-sectional step views following the diagrams (a) to (d) in FIG. 3.
Figure 5:
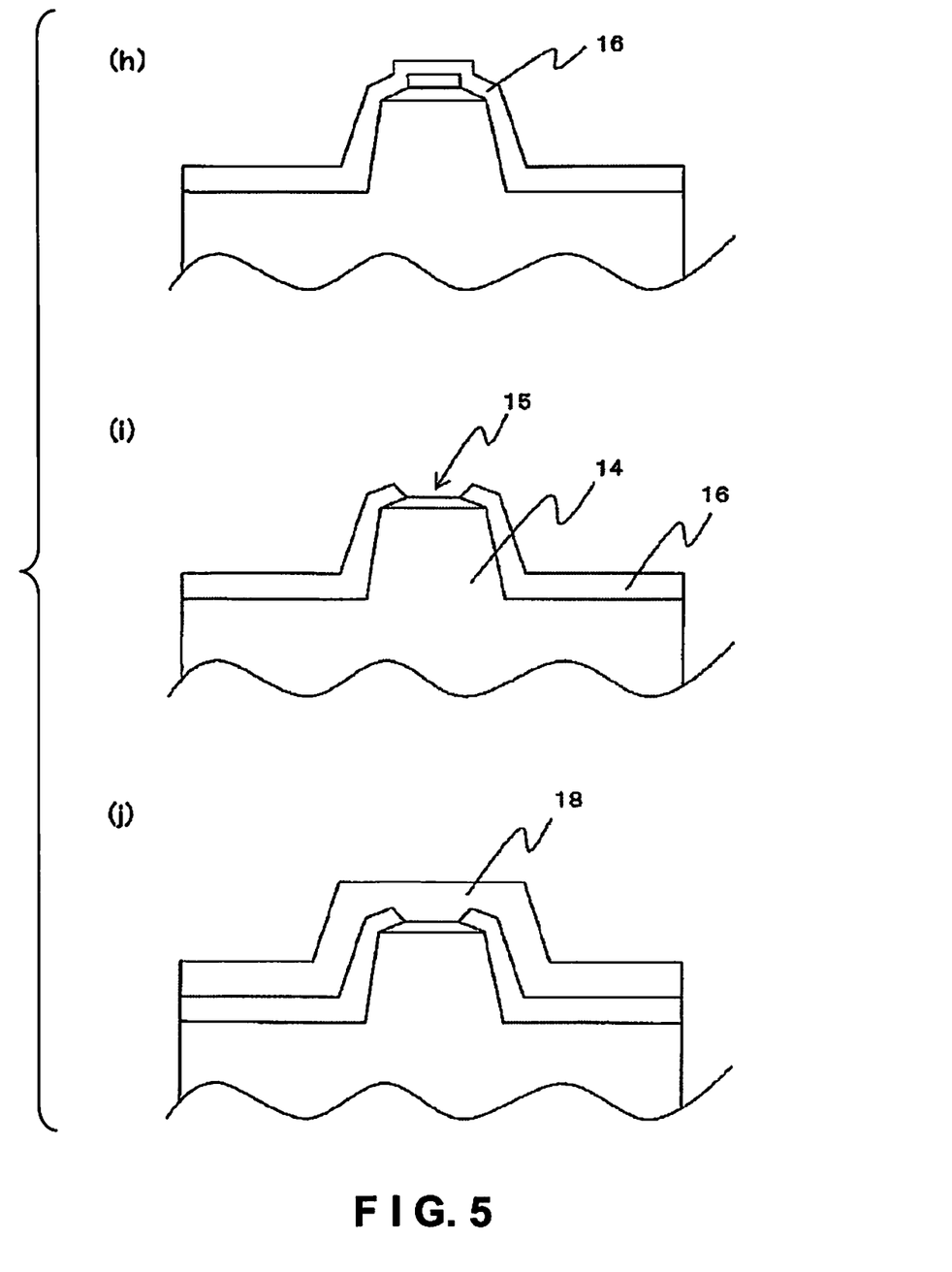
FIG. 5 includes diagrams (h) to (j) that are schematic cross-sectional step views following the diagrams (a) to (d) in FIG. 3.

A method of manufacturing a semiconductor device according to one embodiment of the present invention will be described below with reference to steps (a) to (j) shown in FIGS. 3(a) to 3(d), FIGS. 4(e) to 4(g), and FIGS. 5(h) to 5(j). In the method of manufacturing a semiconductor device, in step (a), firstly, a semiconductor layer including an active layer is formed on a substrate. The semiconductor layer here is such that an n-side semiconductor layer, an active layer, and a p-side semiconductor layer are stacked on a substrate in this order.

The substrate is preferably sapphire, spinel ($MgAl_2O_4$), silicon carbide, silicon, ZnO, GaAs, or a nitride substrate (GaN, AlN, and the like). The thickness of the substrate may be for example, about 50 μm to 10 mm. The nitride substrate may be formed by using a vapor-phase epitaxial method such as MOVPE, MOCVD (Metalorganic Chemical Vapor Deposition), and HVPE (Halide Vapor Phase Epitaxy), a hydrothermal synthesis method in which crystal growth is performed in a supercritical fluid, a high-pressure method, a flux method, a fusion method, or the like. A commercially available nitride substrate may also be used. Such a substrate is further preferably, for example, a nitride substrate having an offset angle of from about 0.03 to 10° in a first principal plane and/or a second principal plane. It is sufficient that the number of dislocation per unit area is $1\times10^7/cm^2$ or less.

The n-side and p-side semiconductor layers among the n-side semiconductor layer, the active layer, and the p-type semiconductor layer are, for example, made of a group III-V nitride semiconductor layer such as AlN, GaN, AlGaN, AlInGaN, and InN. Among those, a nitride semiconductor layer containing Al is suitable. Specifically, a gallium nitride based compound semiconductor layer of $In_yAl_zGa_{1-y-z}N$ (0≤y, 0≤z, y+z≤1), particularly, $Al_xGa_{1-x}N$ (0<x<1) or the like is preferable. Each of the semiconductor layers described above has a single-layer structure or a stacked-layer structure. Alternatively, a structure having a superlattice structure may be employed.

The n-side semiconductor layer has a cladding layer, and further, an optical guide layer or a crack-preventing layer may be provided between the cladding layer and an active layer which is to be described later. An under layer or a crack-preventing layer may be provided between the substrate and the cladding layer. The p-side semiconductor layer has a cladding layer and a contact layer, and a cap layer or an optical guide layer may be provided between the active layer to be described later and the cladding layer.

The n-side semiconductor layer and the p-side semiconductor layer can be formed by using a similar method as used in the nitride substrate. The n-side semiconductor layer is doped with an n-side impurity such as Si or Ge, and the p-side semiconductor layer is doped with a p-side impurity such as Mg or Zn to render respective conductivities. The doping concentration may be, for example, about $1\times10^{16}$ to $5\times10^{20}$ $cm^{-3}$.

The active layer may have either a multiquantum well structure or a single quantum well structure. The thickness of the active layer is suitably, for example, about 10 nm to 500 nm. Particularly, in a case where a quantum well layer structure is employed, the thickness of the well layer and the number of the well layers are not specifically limited. For example, with the thickness in a range from about 1 to 30 nm, Vf, the threshold current density can be reduced. It is preferable that the thickness of the well layer is in a range of 10 nm or less to reduce the thickness of the active layer. The thickness of the barrier layer is, for example, 100 nm or less, and preferably in a range of from about 1 nm to 75 nm. Although the range of the oscillation wavelength of the active layer is not specifically limited, in a case where a nitride semiconductor layer is used, it is, for example, 350 nm or more and 650 nm or less.

Next, a mask layer of a predetermined shape is formed on the semiconductor layer of the wafer where the semiconductor layers are stacked on the substrate. A method of forming a mask layer will be described below, but the method of forming a mask layer is not limited thereto. Firstly, a mask layer 21 (one example of a first mask layer) and a resist layer are formed in this order on the semiconductor layer. The resist layer is patterned into a predetermined shape, and then using the resist layer as a mask, the mask layer is patterned into the same shape as the resist layer. After the mask layer is patterned, the resist layer is removed to obtain the mask layer having the predetermined shape. Examples of the materials of the mask layer include $SiO_2$, SuON, SiN, and the like. The mask layer can be formed using any other known mask material. The thickness of the mask layer is not specifically limited and for example, a thickness of about 100 nm to 1000 nm is suitable, and about 200 nm to 600 nm is preferable. The mask layer can be formed by using a known method such as a CVD method, a sputtering method, and a vapor deposition method.

Next, a ridge is formed on the semiconductor layer. A part of the p-side semiconductor layer at an upper surface of the semiconductor layer is removed from the openings of the mask layer to form a ridge. The method of removing a part of the p-side semiconductor layer is not specifically limited and either wet etching or dry etching can be used. Specifically, in view of the materials of the semiconductor layer, it is preferable that an etchant having a high etching selectivity to the mask layer is selected to remove the layer. The size of the ridge is approximately equal to the size of the mask layer, and the shape of the ridge may be a forward mesa shape having a width larger at the bottom surface side and becoming smaller toward the upper surface, a shape having a side surface perpendicular to the stacked layer surface, or a combination of those. The width of the ridge is not specifically limited, but the semiconductor devices can be manufactured without impairing manufacturing yields, in a case where the width of the ridge is 100 μm or less. The width of the ridge is, for example, suitably about 2.0 μm to 30.0 μm, and preferably about 5.0 μm to 20.0 μm. The height of the ridge can be appropriately adjusted by the thickness of the p-side semiconductor layer. For example, a height of about 0.1 μm to 2 μm, further about 0.2 μm to 1 μm may be employed.

Next, in step (b), a second mask layer 22 is formed at least in a region from the bottom surface of the ridge to the mask layer 21 on the upper surface of the ridge. The second mask layer 22 is formed not only on the bottom region 14a of the ridge and the side surface 14b of the ridge but also on the region of the upper surface of the ridge where the mask layer 21 is formed. Herein, the material for the second mask is not specifically limited, but it is preferable to form a resist pattern in a predetermined pattern. The thickness of the second mask is not specifically limited, and for example, about 0.1 μm to 3.0 μm may be employed.

Next, in step (c), an opening is defined in the second mask layer 22. Herein, an opening is defined in the second mask layer 22 by using photolithography, dry etching, wet etching, or the like. The opening is defined in the second mask layer 22 on the mask layer 21 in a desired stripe shape. The width of the opening is appropriately adjusted according to the width of the ridge. For example, if the width of the ridge is 100 μm or less, the width of the opening will be 99 μm or less. If the width of the ridge is 30 μm or less, the width of the opening will be 1.0 μm to 29.0 μm.

For the method defining an opening portion in the second mask, photolithography may be used in view of the material of the resist pattern and the like, or selecting an appropriate etchant, either wet etching or dry etching may be used. Examples of an appropriate etchant include, a single acid such as nitric acid, hydrofluoric acid, dilute hydrochloric acid, dilute nitric acid, sulfuric acid, hydrochloric acid, acetic acid, and hydrogen peroxide, or a mixture of two or more such acids, a single alkaline solution of ammonia or the like, a mixed solution of ammonia and hydrogen peroxide or the like, and various surface active agents. For the method of removing the second mask remaining unnecessary portions, a known method such as immersion, ultrasonic treatment, or a combination thereof may be used. These methods can also be used for removing other mask layers or a third mask layer.

Next, in step (d), the mask layer 21 is removed from the opening portion of the second mask layer 22. For the method of removing the mask layer 21, etching such as wet etching is preferably used. For the method of removing the mask layer 21, the method used in defining the opening portion in the second mask layer 22, which is described above, can also be used. With this, the upper surface 14c of the ridge is exposed.

Next in step (e), an electrode material film is formed on the upper surface 14c of the ridge and the second mask layer 22. Herein, the electrode material film is formed on the upper surface of the ridge which is exposed after the removing step (d) and on the second mask layer. A known method can be used for the method of forming the electrode material film, but a sputtering method, or a vapor-deposition method is preferably used. Herein, the flat portion 15a and the sloped portions 15b can be formed by forming the electrode 15 through the opening portion of the second mask 22. The width of the electrode which is in contact with the upper surface of the ridge is approximately the same as the width of the ridge. In a case where the width of the ridge is 7.0 μm or larger, the electrode may be formed narrower than the width of the ridge.

A material generally used for an electrode can be used as the electrode material. For example, a single film or stacked layer film of a metal or an alloy, conductive oxide film, or the like, may be employed. The thickness of those electrode materials is suitably about 50 nm to 1000 nm, and preferably about 100 nm to 500 nm. Specific examples include a two-layer structure of Ni (thickness: about 5 to 20 nm) at the semiconductor layer side and Au (thickness: about 50 to 300 nm), and Ni—Au—Pt, Ni—Au—Rh, Ni—Au—$RhO_2$, Ni—Au—Pd, Ni—Au—Ir, Ni—Au—Ru, or the like, including the two-layer structure. Examples thereof also include two layer structures such as Pd—Au, Pd—Pt, and Ni—Pt, and three layer structures such as Ni—ITO—Pt, Ni—ITO—Rh, Pd—Pt—Au, Pd—Pt—Rh, Pd—Pt—Ir, and Rh—Ir—Pt. Those electrode material films can be formed by using a known method such as a CVD method, a sputtering method, and a vapor deposition method. The thickness of the electrode material film is not specifically limited, and for example, employing a thickness of about 50 nm or more enables to reduce the sheet resistance.

Next, in step (f), the second mask layer 22 and the electrode material 15 thereon are removed to expose the bottom surface region 14a and the side surface 14b of each side of the ridge. Herein, removing the second mask layer 22 also removes the electrode material 15 thereon at the same time. Any one of the methods described above can be used for removing the second mask layer 22, but a liftoff method or a wet etching method is preferably used.

Next, in step (g), a third mask layer 23 is formed on the flat portion 15a of the electrode. Herein, a resist layer is formed in a pattern as the third mask 23. For the method of forming the third mask layer in a pattern, photolithography is preferably used. The thickness of the third mask 23 is not specifically limited, and for example, a thickness of about 0.1 μm to 4.0 μm may be employed. The third mask layer 23 may cover only the entire upper surface of the flat portion 15a of the electrode, may cover the entire upper surface of the flat portion 15a of the electrode and a part of the sloped portion 15b of the electrode, or may cover only slightly smaller portion than the flat portion 15a of the electrode.

Next, in step (h), a protective film 16 is formed to cover the bottom surface regions 14a of the ridge, the side surfaces of the ridge 14b, the sloped portions of the electrode 15b, and the third mask layer 23. The protective film 16 is formed by using a known method in the art such as a sputtering method, a vacuum deposition method, or a vapor-phase growth method. The thickness of the protective film is, for example, 3000 nm or less, preferably about 20 nm to 1000 nm, and suitably about 50 nm to 500 nm.

The protective film 16 secures insulation between the upper surface of the p-side semiconductor layer, which is the bottom surface region 14a of the ridge, and the side surfaces of the ridge, and also secures the difference in refractive index between the p-side semiconductor layer and the protective film 16, thus, capable of controlling the leakage of light from the active layer. Also, the semiconductor device according to the embodiment has an end portion 16a of the protective film formed in a latter step, thus absorption of light at the upper portion of the ridge can be prevented. The material of the protective film is not specifically limited as long as the material has insulation property. Examples thereof include Si, Mg, Al, Hf, Nb, Zr, Sc, Ta, Ga, Zn, Y, B, Ti, and chemical compounds thereof, such as oxides, nitrides (for example, AlN, AlGaN, BN and so on) and fluorides. The protective film may be a single film or a multilayer film of a combination of a plurality of materials described above. Among those, a film made of a material having low refractivity and low absorption property such as $SiO_2$ and $Al_2O_3$ is preferable.

Next, in step (i), the third mask layer 23 and the protective film 16 are removed from the upper surface of the ridge. By removing the protective film which is located over the upper surface of the ridge, the uppermost end of the end portion 16a of the protective film is positioned higher than the ridge. With this, the upper surface 14c of the ridge is exposed. The sloped portions of the electrode on the ridge are covered with the protective film. In step (i), the end portion 16a of the protective film may entirely cover the sloped portions 15b of the electrode, or may partially cover the sloped portions 15b of the electrode with a part of the sloped portion 15b being exposed. Further, it is preferable that if the uppermost end of the end portion 16a of the protective film is positioned higher than the upper portion of the electrode, that is, if it is at higher position than the surface of the flat portion 15a of the electrode, the light absorption by the pad electrode can also be prevented efficiently. It is further preferable that if the upper most end of the end portion 16a of the protective film is positioned 100 nm or more higher than the surface of the flat portion 15a of the electrode which is the upper surface of the electrode, the light absorption by the pad electrode can be prevented more efficiently.

The end portion 16a of the protective film is formed at this state by removing the mask layer and the protective film provided above the upper surface of the ridge. Therefore, the end portion 16a of the protective film is formed on each side of the ridge so as to continuously extend in a region from the side surface 14b of the ridge toward the upper surface of the ridge. The height of the uppermost end of the end portion 16a of the protective film can be adjusted by the thickness of the third mask layer. The height of the uppermost end of the end portion 16a of the protective film is preferably in a range of about 50 nm to 1000 nm from the upper surface 14c of the ridge. Also, the height of the uppermost end of the end portion 16a of the protective film is more preferably 100 nm or higher than the upper surface of the electrode. If the height of the uppermost end of the end portion 16a of the protective film is in this range, light absorption at the upper surface of the ridge can be prevented. Also, a recessed shape is defined in the bonding region of the protective film and the electrode with the upper surface of the electrode forming a bottom of the recessed shape and the end surfaces of the protective film forming side surfaces of the recessed shape, thus adhesion between the electrode 15 and the pad electrode 18 can be improved. If the bonding region with the electrode is arranged at the end portion 16a of the protective film, a groove of recess portion can be easily formed.

Herein, the method of removing the third mask layer 23 and the protective film formed on the third mask layer 23 is not specifically limited, and a liftoff method can be used, for example. The conditions of liftoff can be appropriately selected by, for example, the materials etc. of the mask layer and protective film. For example, it is suitable to use an appropriate etchant such as a single acid or a mixture of two or more acids of nitric acid, hydrofluoric acid, sulfuric acid, hydrochloric acid, acetic acid, and hydrogen peroxide, or a single alkaline solution of ammonia or the like, a mixed solution of ammonia and hydrogen peroxide or the like, and various surface active agents. Also, a known method such as immersion, rinsing, ultrasonic treatment, or a combination thereof may be used.

Further, in any step after step (i), as step (j), a pad electrode 18 is formed on the semiconductor device, on the protective film 16 and the electrode 15. The pad electrode is preferably a stacked layer film made of metals such as Ni, Ti, Au, Pt, Pd, and W. Specific examples thereof include W—Pd—Au or Ni—Ti—Au, Ni—Pd—Au formed in this order from the p-electrode side. The thickness of the pad electrode is not specifically limited, but it is preferable that the thickness of Au which is the final layer is about 100 nm or more. The shape of the pad electrode is not specifically limited.

In a method of manufacturing a semiconductor device according to the embodiment, it is preferable to polish a second principal surface of the substrate at any appropriate stage, for example, before forming the n-side electrode. Any known method in the art can be used for polishing the substrate.

Further, the n-side electrode is preferably formed on a part or entire surface of the second principal surface of the substrate, before or after forming the p-side electrode described above. The n-side electrode can be formed by using, for example, a sputtering method, a CVD method, an evaporation method, or the like. A liftoff method is preferably used for forming the n-side electrode in a pattern, and after forming the n-side electrode, annealing is preferably carried out at about 300° C. or higher. For the n-side electrode, for example, it is sufficient that the total thickness is about 1 μm or less. The material of the n-side electrode is not specifically limited, and for example, V (thickness of 10 nm)-Pt (thickness of 200 nm)-Au (thickness of 300 nm) are stacked in this order from the substrate side to form the n-side electrode. Other examples thereof include Ti (15 nm)-Pt (200 nm)-Au (300 nm), Ti (10 nm)-Al (500 nm), Ti (6 nm)-Pt (100 nm)-Au (300 nm), Ti (6 nm)-Mo (50 nm)-Pt (100 nm)-Au (210 nm), or the like.

A metallization electrode may be formed on the n-side electrode. The metallization electrode can be made of, for example, Ti—Pt—Au—(Au/Sn), Ti—Pt—Au—(Au/Si), Ti—Pt—Au—(Au/Ge), Ti—Pt—Au—In, Au—Sn, In, Au—Si, Au—Ge, and the like. The thickness of the metallization electrode is not specifically limited. In a case where ohmic property is maintained only by the metalizing electrode, the n-side electrode can be omitted.

Optionally, for example, a second protective film may be formed on the protective film 16 after step (i). The second protective film can be formed by using any known method in the art, and the materials thereof can be selected from the same materials as the above described materials of the protective film.

Next, a cavity end surface is formed on the semiconductor layer. The cavity end surface can be formed by using any known method in the art such as etching, cleaving, or the like. Also, a dielectric film is preferably formed in an appropriate stage on the obtained cavity end surface, that is, on the light-reflecting side and/or light emitting side of the cavity end surface. The dielectric film is preferably a single-layer film or a multi-layer film made of $SiO_2$, $ZiO_2$, $TiO_2$, $Al_2O_3$, $Nb_2O_5$, MN, AlGaN, or the like. Further, by dividing in the cavity direction (resonating direction), semiconductor device chips can be obtained. The dividing can be carried out by forming a guiding groove in an appropriate stage and scribing, for example.

According to the method of manufacturing the semiconductor device of the embodiment, a semiconductor device of high reliability can be formed by simplified steps without limitation of the material of the protective film and electrodes. That is, an etch-back step, which is difficult to be controlled in a typical semiconductor process, can be eliminated, and thus enables controlling of each steps with high accuracy. Therefore the manufacturing yield of a semiconductor device can be improved with simplified steps. Also, according to the method of manufacturing of the embodiment, mass production efficiency of a semiconductor device can be improved.

Examples of the semiconductor device according to the present invention will be described below, but the present invention is not limited thereto. The semiconductor device herein will be exemplified with a semiconductor laser device.

Example 1

A semiconductor laser device of the present example includes, as shown in FIG. 1, a semiconductor layer of an n-side semiconductor layer 11, an active layer 12, and a p-side semiconductor layer 13 stacked in this order is formed on a GaN substrate 10 having a C-plane as a growth surface, and a ridge 14 is formed on the surface of the p-side semiconductor layer 13. A p-side electrode 15 is ohmically connected to the upper surface of the ridge 14. The electrode 15 has a flat portion 15a and sloped portions 15b. Each sloped portion 15b of the electrode is covered with the end portion 16a of the protective film and a pad electrode is electrically connected to the flat portion 15a of the electrode 15.

Further, although not shown, a dielectric film made of $Al_2O_3$ is formed on the cavity end surface of the semiconductor layer. Also, a p-side pad electrode 18 is formed to cover the electrode 15 and the protective film 16.

Such a semiconductor laser device can be formed according to a method of manufacturing described below.

Formation of Ridge

Firstly, a GaN substrate 10 is prepared. Next, on the substrate 10, a semiconductor layer 20 of an n-side semiconductor layer 11, an active layer 12, and a p-side semiconductor layer 13 stacked in this order is formed. Then, a mask layer 21 of $SiO_2$ film is formed with a thickness of 500 nm on the approximately entire surface of the p-side semiconductor layer 13 by using a CVD apparatus. Thereafter, a pattern with a width of 15.0 μm is formed in the mask layer by way of etching using an RIE (Reactive Ion Etching) apparatus. In this stage, the width of the mask layer is adjusted to the width of the ridge which will be described later.

Next, as shown in FIG. 3(a), a ridge is formed on the surface of the stacked semiconductor layer 20. Specifically, the ridge 14 is formed on the surface of the p-side semiconductor layer 13 which is an upper layer of the semiconductor layer 20. Here, using an RIE apparatus, etching is carried out on the p-side semiconductor layer 13 which is exposed at the opening of the mask layer 21 to form a stripe-shaped ridge 14 of about 15.0 μm in width and about 0.8 μm in height.

Thereafter, as shown in FIG. 3(b), a second mask layer 22 is formed to cover from the bottom surface region 14a of the ridge to the upper surface of the mask layer 21. The second mask layer is formed with a resist layer with a thickness of 1.2 μm.

Next, as shown in FIG. 3 (c), an opening is defined in the second mask layer 22. The opening is formed by performing etching on the second mask layer 22 using an RIE apparatus. The etching is performed on the second mask layer 22 over the mask layer 21 with the width of 13.0 μm in the stripe direction of the ridge. The surface of the mask layer is exposed by this etching.

Next, as shown in FIG. 3(d), the mask layer 21 exposed in the previous step is removed by wet etching. With this, the upper surface 14c of the ridge is exposed.

Formation of Electrode

Next, as shown in FIG. 4 (e), an electrode 15 is formed on the ridge 14 and the second mask layer 22. The electrode 15 is formed on the ridge through the opening of the second mask layer. Therefore, a flat portion 15a is formed on the center portion of the ridge and a sloped portion 15b is formed on each of the both sides of the center portion of the ridge. The electrode may be formed with the material of Ni—Au—Pt in this order from the upper surface 14c of the ridge. Here, the width of the flat portion 15a of the electrode 15 is 13.0 μm and the width of the sloped portion 15b formed each of the both sides of the flat portion is 1.0 μm. Here, the thickness of the electrode is the thickness of the flat portion 15a, and a total thickness is 210 nm with Ni (10 nm)-Au (100 nm)-Pt (100 nm) formed in this order.

Next, as shown in FIG. 4 (f), removing the second mask layer 22 also removes the electrode formed on the second mask layer 22. The removal of the second mask layer is carried out employing a lift-off method in which a release solution is used. Through this method, the electrode on the second mask layer is also removed together with the second mask layer. The electrode 15 is in contact with the semiconductor layer only on the upper surface 14c of the ridge, so that current leakage does not occur.

Next, as shown in FIG. 4 (g), a third mask layer 23 is formed on the flat portion 15a of the electrode formed on the ridge 14. A resist layer id used as the third mask layer 23. The width of the third mask layer 23 is about 13.0 μm and the thickness of the third mask layer is about 2.5 μm.

Formation of Protective Film

Thereafter, as shown in FIG. 5 (h), a protective film 16 is formed to cover the bottom surface regions 14a of the ridge, the side surfaces 14b of the ridge, the sloped portions 15b of the electrode, and the upper surface of the third mask layer 23. The protective film 16 is a $SiO_2$ film with a thickness of 200 nm formed by using a sputtering apparatus.

Next, the third mask layer 23 formed on the electrode and the protective film 16 formed on the third mask layer 23 are removed. A lift-off method is used to remove the third mask layer. This exposes the flat portion 15a of the electrode. Also, an uppermost end of an end portion 16a of the protective film which is extended to a position higher than the upper surface of the ridge is formed in the protective film 16 which covers each side surface of the ridge. In this example, the height of an uppermost end of each end portion 16a of the protective film is 500 nm from the upper surface 14c of the ridge. With the uppermost end of the end portions 16a of the protective film being higher than the upper surface of the ridge with this amount, absorption of laser beam by the electrodes around the upper surface of the ridge and the side surfaces of the ridge can be prevented. Although only the flat portion 15a of the electrode is exposed in FIG. 5 (i), a part of the sloped portion 15b of the electrode may also be exposed. Also, the end portion 16a of the protective film may cover a part of the flat portion 15a of the electrode.

Next, a second protective film is formed on the bottom surface region 14a of the ridge, in a region spaced apart by about 35 μm from a side surface 14b of the ridge. The second protective film further covers the side surfaces of the semiconductor layer. The second protective film is not shown in the figure. Thereafter, as shown in FIG. 5 (j), a p-side pad electrode 18 is formed on the electrode 15 and the protective film 16. Also, an n-side electrode 19 is formed on the back surface of the substrate 10. On the cavity end surface at the front side of the semiconductor layer, a dielectric film made of $Al_2O_3$ is formed. On the cavity end surface at the back side of the semiconductor layer, a dielectric multilayer film made of $ZrO_2$ and $SiO_2$ is formed. In this manner, a semiconductor device can be formed.

As described above, in Example 1, the electrode is connected only at the upper surface of the ridge, so that leakage of current due to the electrode comes in contact with a side surface of the ridge can be prevented. Also, a sloped portion is provided on the electrode and a protective film made of $SiO_2$ which is a material having a low refractivity is applied on the sloped portion. Thus, absorption of light by the electrode can be prevented and the extraction efficiency of laser beam can be improved. Further, with the manufacturing steps as described above, an etch-back step is no longer necessary, which facilitates manufacturing of the semiconductor devices with stable properties.

Example 2

Figure 2A:
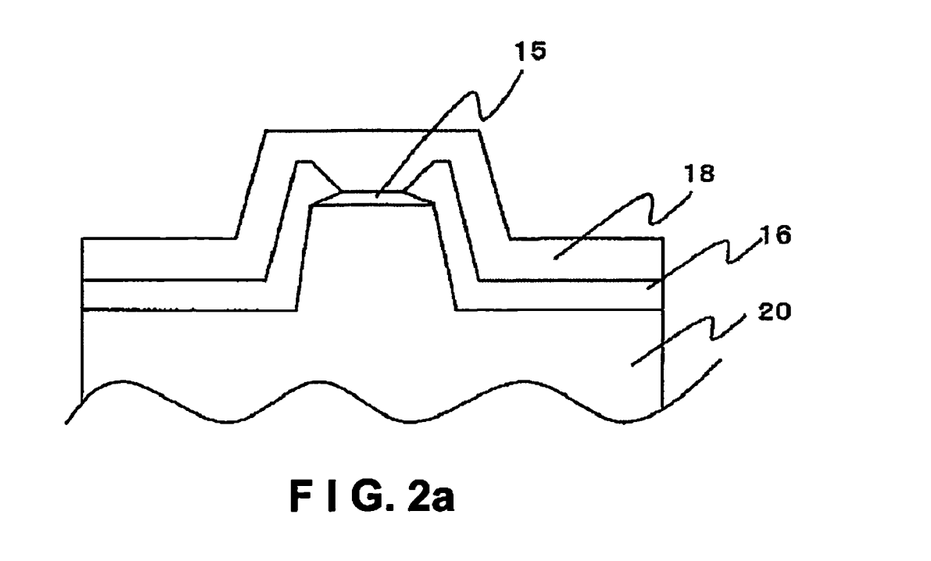
FIG. 2a is a partial schematic cross sectional view of a structure of a semiconductor device according to an embodiment of the present invention.
Figure 2B:
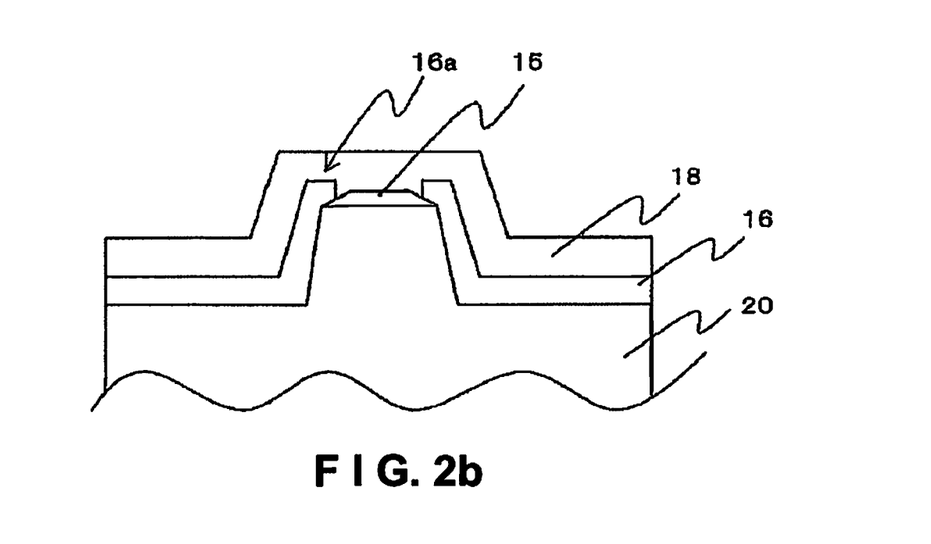
FIG. 2b is a partial schematic cross sectional view of a structure of a semiconductor device according to an embodiment of the present invention.

The semiconductor laser device of the present example is formed such that the third mask layer 23 is formed to cover the flat portion and a part of the sloped portion of the electrode in the manufacturing steps described in Example 1. Specifically, the width of the third mask layer 23 is about 14.0 μm and the thickness of the third mask layer is about 2.5 μm. Except as described above, the semiconductor laser device is manufactured in substantially the same manner as the semiconductor laser device of Example 1. Accordingly, as shown in FIG. 2b, a region covered by the tip end portion 16a of the protective film and a region connected to the p-side pad electrode are formed on each sloped portion of the electrode. Substantially the same effects as in Example 1 can also be obtained in this example.

Example 3

Figure 2C:
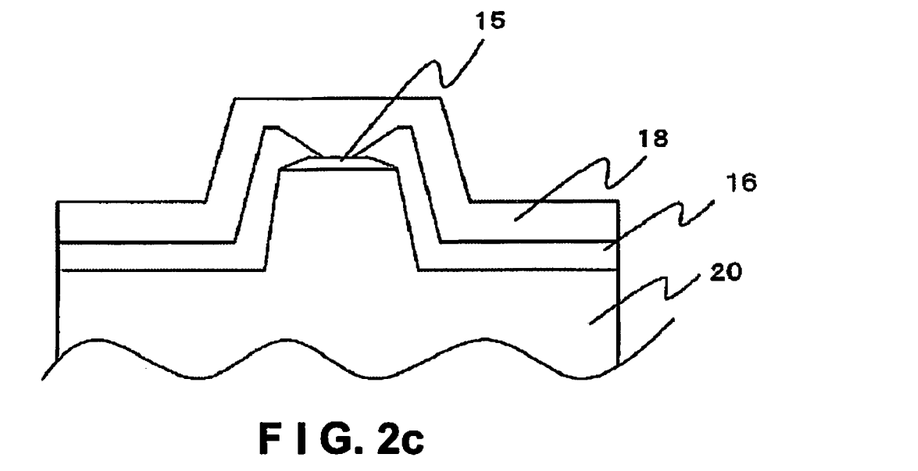
FIG. 2c is a partial schematic cross sectional view of a structure of a semiconductor device according to an embodiment of the present invention.

The semiconductor laser device of the present example is formed such that the third mask layer 23 is formed to cover only the flat portion of the electrode in the manufacturing steps described in Example 1. The width of the third mask layer 23 is about 12.0 μm and the thickness of the third mask layer is about 2.5 μm. Except as described above, the semiconductor laser device is manufactured in substantially the same manner as the semiconductor laser device of Example 1. Accordingly, as shown in FIG. 2c, the tip end 16a of the protective film covers the sloped portions 15b of the electrode and a part of the flat portion 15a of the electrode. Effects substantially the same as that in Example 1 can also be obtained in this example.

Example 4

Figure 2D:
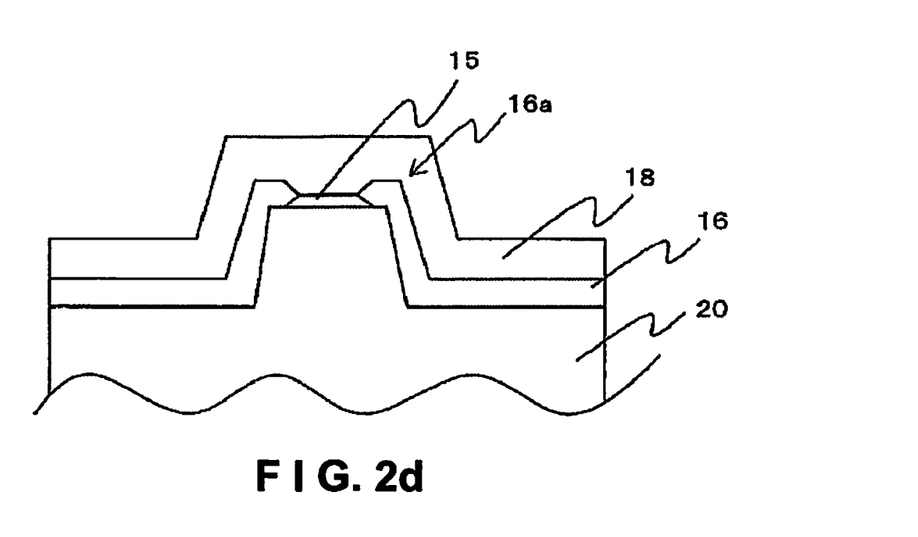
FIG. 2d is a partial schematic cross sectional view of a structure of a semiconductor device according to an embodiment of the present invention.

The semiconductor laser device of the present example is formed as described in Example 1 except that the electrode on the upper surface 14c of the ridge is formed so as not to entirely cover the upper surface 14c of the ridge and to expose a part of upper surface. Specifically, the width of the opening of the second mask layer 22 is 10.0 μm. With a width of about 12.0 μm, the third mask layer 23 is formed to cover only the flat portion of the electrode. Except as described above, the semiconductor laser device is manufactured in substantially the same manner as the semiconductor laser device of Example 1. Thus, as shown in FIG. 2d, the end portion of the upper surface 14c of the ridge is covered with the protective film and further, the end portion 16a of the protective film covers the sloped portions 15b of the electrode. Effects substantially the same as that in Example 1 can also be obtained in this example.

The semiconductor devices according to the present invention can be used in light emitting elements such as semiconductor lasers and light emitting diodes. Examples of the applications include, a light source for lighting, displays, optical disk applications, optical communication systems, printers, optical exposure applications, various devices for measurement, excitation light source for bio-specific applications It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a semiconductor device comprising:
   forming a ridge on a semiconductor layer stacked on a substrate by forming a first mask layer having a predetermined shape on the semiconductor layer and removing a part of the semiconductor layer from an opening of the first mask layer;
   forming a second mask layer on a region from at least a bottom surface region of the ridge to the first mask layer on an upper surface of the ridge;
   removing a part of the second mask layer on the upper surface of the ridge to define an opening having a diameter smaller than a width of the ridge;
   removing the first mask layer on the upper surface of the ridge to expose the upper surface of the ridge;
   forming an electrode on the ridge so as to have a flat portion having a flat surface substantially parallel to the upper surface of the ridge and sloped portions on both sides of the flat portion with each of the sloped portions having a sloped surface that is sloped with respect to the upper surface of the ridge;
   removing the second mask layer;
   forming a third mask layer on the flat surface of the flat portion of the electrode;
   forming a protective film on a region from at least the bottom surface region of the ridge to the third mask layer on the upper surface of the ridge;
   removing the third mask layer and a part of the protective film on the upper surface of the ridge to expose the electrode; and
   forming a pad electrode at least on an upper surface of the electrode and the protective film.

2. The method of manufacturing a semiconductor device according to claim 1, wherein
   the electrode has a stacked-layer structure that includes a two-layer structure, and the two-layer structure has a nickel layer at a side of the semiconductor layer.

3. The method of manufacturing a semiconductor device according to claim 2, wherein
   a thickness of the nickel layer is 5 nm to 20 nm.

4. The method of manufacturing a semiconductor device according to claim 1, wherein
   the pad electrode has an uppermost layer that is made of Au.

5. The method of manufacturing a semiconductor device according to claim 4, wherein
   a thickness of the uppermost layer made of Au is 100 nm or more.

6. The method of manufacturing a semiconductor device according to claim 1, wherein
   the removing of the third mask layer and the part of the protective film includes removing the part of the protective film so that an uppermost end position of the protective film is higher than the upper surface of the electrode and so that the protective film is disposed on each side of the ridge to cover a region from the side surface of the ridge to the sloped surface of the sloped portion of the electrode.

7. The method of manufacturing a semiconductor device according to claim 1, wherein
   the forming of the pad electrode includes forming the pad electrode on the electrode through a conductive layer.

8. The method of manufacturing a semiconductor device according to claim 1, wherein
   a thickness of the electrode is 100 nm to 500 nm.

9. The method of manufacturing a semiconductor device according to claim 1, wherein
   the electrode has a stacked-layer structure that includes one of Ni—Au—Pt, Ni—Au—Rh, Ni—Au—RhO$_2$, Ni—Au—Pd, Ni—Au—Ir, Ni—Au—Ru, Ni—Pt, Ni—ITO—Pt, and Ni—ITO—Rh, and each of the Ni—Au—Pt, the Ni—Au—Rh, the Ni—Au—RhO$_2$, the Ni—Au—Pd, the Ni—Au—Ir, the Ni—Au—Ru, the Ni—Pt, the Ni—ITO—Pt, and the Ni—ITO—Rh is arranged in order from a side of the semiconductor layer.

10. The method of manufacturing a semiconductor device according to claim 1, wherein
    the pad electrode is a stacked layer film made of metals selected from Ni, Ti, Au, Pt, Pd, and W.

11. The method of manufacturing a semiconductor device according to claim 1, wherein
    the pad electrode includes one of W—Pd—Au, Ni—Ti—Au, and Ni—Pd—Au, and each of the W—Pd—Au, the Ni—Ti—Au, and the Ni—Pd—Au is formed in order from a side of the electrode.

12. The method of manufacturing a semiconductor device according to claim 1, wherein
    a width of the flat portion of the electrode is 1.8 μm to 25.0 μm.

13. The method of manufacturing a semiconductor device according to claim 1, wherein
    a length of each of the sloped portions is in a range of 0.1 μm to 3.0 μm.

14. A method of manufacturing a semiconductor device comprising:
    forming a ridge on a semiconductor layer stacked on a substrate by removing a part of the semiconductor layer;
    forming an electrode on the ridge so as to have a flat portion having a flat surface substantially parallel to the upper surface of the ridge and sloped portions on both sides of the flat portion with each of the sloped portions having a sloped surface that is sloped with respect to the upper surface of the ridge;
    forming a protective film disposed on each side of the ridge to cover a region from the side surface of the ridge to the sloped surface of each of the sloped portions of the electrode by
       forming a third mask layer on the flat portion of the electrode with a part of the sloped portions being exposed,
       forming a protection film covering bottom surface regions and the side surface of the ridge, the sloped portions of the electrode, and the third mask layer, and
       removing the third mask layer by a lift-off method so as to form the protection film in which an end portion of the protective film disposed on the sloped portions is positioned higher than an other portion other than the end portion of the protective film; and
    forming a pad electrode at least on an upper surface of the electrode and the protective film.

15. The method of manufacturing a semiconductor device according to claim 14, wherein
    the forming of the protective film includes forming the protective film so that an uppermost end position of the protective film is higher than the upper surface of the electrode.

16. The method of manufacturing a semiconductor device according to claim 14, wherein the forming of the pad electrode includes forming the pad electrode on the electrode through a conductive layer.

17. The method of manufacturing a semiconductor device according to claim 14, wherein
the electrode has a stacked-layer structure that includes a two-layer structure, and the two-layer structure has a nickel layer at a side of the semiconductor layer.

18. The method of manufacturing a semiconductor device according to claim 14, wherein
a width of the flat portion of the electrode is 1.8 µm to 25.0 µm.

19. The method of manufacturing a semiconductor device according to claim 14, wherein
a length of each of the sloped portions is in a range of 0.1 µm to 3.0 µm.

\* \* \* \* \*